(12) United States Patent
Arnet

(10) Patent No.: US 9,071,169 B2
(45) Date of Patent: Jun. 30, 2015

(54) PROGRAMMABLE GATE CONTROLLER SYSTEM AND METHOD

(75) Inventor: Beat Arnet, Winchester, MA (US)

(73) Assignee: GE Hybrid Technologies, LLC, Albany, NY (US)

(*) Notice: Subject to any disclaimer, the term of this patent is extended or adjusted under 35 U.S.C. 154(b) by 592 days.

(21) Appl. No.: 13/385,403

(22) Filed: Feb. 17, 2012

(65) Prior Publication Data

US 2012/0212075 A1 Aug. 23, 2012

Related U.S. Application Data

(60) Provisional application No. 61/463,606, filed on Feb. 18, 2011.

(51) Int. Cl.
| | |
|---|---|
| *H02M 7/5387* | (2007.01) |
| *H02M 1/08* | (2006.01) |
| *H03K 17/20* | (2006.01) |
| *H03K 17/689* | (2006.01) |
| *H01H 31/10* | (2006.01) |
| *H03K 17/78* | (2006.01) |

(52) U.S. Cl.
CPC .............. *H02M 7/5387* (2013.01); *H02M 1/08* (2013.01); *H03K 17/20* (2013.01); *H03K 17/689* (2013.01); *H03K 17/78* (2013.01)

(58) Field of Classification Search
CPC ...................................................... H01H 31/10
USPC ........................................................ 307/115
See application file for complete search history.

(56) References Cited

U.S. PATENT DOCUMENTS

| | | | |
|---|---|---|---|
| 4,425,628 A | 1/1984 | Bedard et al. | |
| 4,528,662 A | 7/1985 | Floyd et al. | |
| 5,616,970 A * | 4/1997 | Dittrich | 307/126 |
| 6,005,377 A * | 12/1999 | Chen et al. | 323/283 |
| 6,297,610 B1 | 10/2001 | Bauer et al. | |
| 2005/0088156 A1* | 4/2005 | Cheung et al. | 323/282 |
| 2007/0027570 A1* | 2/2007 | Buhler et al. | 700/162 |
| 2011/0161420 A1 | 6/2011 | DeAlto et al. | |

OTHER PUBLICATIONS

International Search Report and Written Opinion for International Application No. PCT/US2013/026325 from the International Searching Authority, dated Apr. 19, 2013, 8 pages (unnumbered).
Dulau et al., "A New Gate Driver Integrated Circuit for IGBT Devices With Advanced Protections", IEEE Transactions on Power Electronics, vol. 21, No. 1, Jan. 2006, pp. 38-44.
Gerster et al., "Gate-Controlled dv/dt- and di/dt-Limitation in High Power IGBT Converters", EPE Journal, vol. 5, No. 3/4, Jan. 1996, pp. 1-14.

(Continued)

*Primary Examiner* — Robert Deberadinis
(74) *Attorney, Agent, or Firm* — Conley Rose, P.C.; J. Robert Brown, Jr.

(57) ABSTRACT

Controlling power switches with a programmable gate controller system proximate associated power switches and remote from the central controller including sensing at least one predetermined condition local to the associated power switches; reporting the sensed conditions to the remote programmable gate controller system; developing, in response to the sensed condition at least one control signal in the remote programmable gate controller system; and applying the control signal to the associated power switches.

25 Claims, 10 Drawing Sheets

(56) References Cited

OTHER PUBLICATIONS

N. Idir et al., "Gate-Voltage Control Minimizes EMI from IGBTs", Power Electronics Technology, http://powerelectronics.com/power_semiconductors/igbts/power_gatevoltage_control_minimizes/, Feb. 1, 2004, 2 pages.

Igarashi et al., "Analysis and Reduction Methods of EMI Radiation Noise From Converter System", Proc. 29$^{th}$ Annual IEEE PESC, vol. 2, pp. 1152-1158, 1998.

Motto et al., "Speed Shifting Gate Drive for Intelligent Power Modules", Applied Power Electronics Conference and Exposition, 2006, pp. 1684-1690.

Motto et al., "Large Package Transfer Molded DIP-IPM", Industry Applications Society Annual Meeting, 2008, pp. 1-5.

D.O. Neascu, "Active Gate Drivers for Motor Control Applications", Proc. PELS Tutorial, 2001, 71 pgs. (unnumbered).

Takizawa et al., A New DI/DT Control Gate Drive Circuit for IGBTs to Reduce EMI Noise and Switching Losses, Proc. 29$^{th}$ Annual IEEE PESC, vol. 2, pp. 1443-1449, 1998.

De Castro, Ricardo, et al.; "Control in Multi-Motor Electric Vehicle with a FPGA Platform"; University of Porto; 2009; pp. 219-227.

* cited by examiner

*FIG. 1*

PRIOR ART

PROGRAMMABLE GATE CONTROLLER SYSTEM AND METHOD

RELATED APPLICATIONS

This application claims benefit of and priority to U.S. Provisional Application Ser. No. 61/463,606 filed Feb. 18, 2011 under 35 U.S.C. §§119, 120, 363, 365, and 37 C.F.R. §1.55 and §1.78 incorporated herein by this reference.

FIELD OF THE INVENTION

This invention relates to programmable gate controller system and method and more particularly to a remote, distributed programmable gate controller system and method applicable to power semiconductors.

BACKGROUND OF THE INVENTION

In power converter circuits such as inverters for motor drives, solar power conversion, wind power conversion, as well as battery chargers and uninterruptable power supplies, it is typical to be using a centralized controller or microprocessor, DSP or FPGA which commands the turning-on and turning-off of the power conversion switches (power semiconductors) based on sensor feedback, setpoints and control algorithms.

The turn-on, turn-off commands are transmitted via digital lines to gate driver circuits, which more or less directly command the power switches on or off, based on the level of the digital signals (e.g. high=on /low=off).

A typical three phase inverter has six power switches, and therefore six digital lines are required between the centralized microprocessor and the gate drivers (one for each switch). For reasons of noise immunity and safety, it is further typical that the central microprocessor is galvanically isolated from the gate drivers by mean s of optical, capacitive or inductive coupling. This isolation is normally achieved at the gate driver, and is required for each line.

In addition to the gate control lines power converter circuits also typically require connections from the gate driver to the central controller processor to signal fault conditions. A total of six fault lines will be needed, if faults are to be attributable to each gate driver (and switch), resulting in a total of twelve isolated lines between the central processor and gate drivers.

This large number of digital lines and isolation barriers results in cost and complexity. Furthermore, the simple digital lines only offer very limited functionality: the commands that are transmitted to the gate-drivers have only two states (on or off), while the information returned by the gate driver is also binary (no-fault or fault). This centralized approach, besides being not optimal in terms of cost and reliability, seriously limits the role that the gate driver can play in the control of the power conversion, and prevents the system designer from fully utilizing the power conversion circuit in an intelligent and distributed fashion.

For example, the control of the power switches is limited to simple on/off commands issued by the central processor and does not allow for real time adjustments based on actual operating conditions. The feedback from the gate driver is a simple OK/not-OK and does not provide any additional information that could aid the performance of the power conversion or provide for diagnostics.

Furthermore, due to the delays from the measurement circuits to the processor and subsequently to the power switches the bandwidth of the control algorithms is inherently limited with the conventional approach.

SUMMARY OF THE INVENTION

It is therefore an object of this invention to provide an improved programmable, gate controller system and method.

It is a further object of this invention to provide such an improved programmable, gate controller system and method which enables localized real time control of switching rates and on/off ratios of the power switch(es).

It is a further object of this invention to provide such an improved programmable, gate controller system and method which enables development of self-learning algorithms to track localized trends of the power switch(es).

It is a further object of this invention to provide such an improved programmable, gate controller system and method application of real time diagnostics to anticipate and detect potential failure modes of the power switch(es).

It is a further object of this invention to provide such an improved programmable, gate controller system and method which enables communication of real time and detailed information from distributed, remote programmable gate controllers proximate the power switch(es) to the central controller enabling implementation of more sophisticated control loops and algorithms.

It is a further object of this invention to provide such an improved programmable, gate controller system and method which reduces cost, increase reliability and accommodates more advanced, high bandwidth, more intelligent algorithms.

It is a further object of this invention to provide such an improved programmable, gate controller system and method which enables local, high bandwidth control loops.

The subject invention results from the realization that, in part, an improved programmable gate controller system and method in various aspects can be achieved by sensing at least one predetermined condition local to the associated power switches, reporting the sensed conditions to a programmable gate controller remote from the central controller, developing, in response to the sensed condition at least one control signal in the remote programmable gate controller and applying the control signal to the associated power switches This invention features a programmable gate controller system including at least one programmable gate controller adapted for connection to a central controller, at least one power switch interconnected with and controllable by the programmable gate controller, the programmable gate controller including an amplifier for driving the power switch and a programmable device for operating the amplifier.

In a preferred embodiment there may be a communication link between the programmable gate controller and the central controller. The link may be bidirectional. The link may include an isolation device. The communication link may be according to SPI. The communication link may be according to CAN. The power switch may include an FET. The power switch may include an IGBT. At least one sensor for sensing a local condition at the power switch. The programmable device may be configured to generate commands, in response to the sensor, to vary the switching rate and/or on/off ratio of the power switch. The programmable device may be configured to generate commands, in response to the sensor, to track trends in conditions local to the power switch. The programmable device may be configured to generate commands, in response to the sensor, to anticipate and detect potential failure modes of the power switch. The communication link may carry switch control commands and parameters from the central controller to the programmable gate controller and from the programmable gate controller to the central controller. The amplifier and the programmable device may be on the same chip. The power switch may include an IGBT. The power switch may include an FET.

This invention also features a method of controlling power switches with a programmable gate controller system proximate associated power switches and remote from the central controller including sensing at least one predetermined condition local to the associated power switches, reporting the sensed conditions to the remote programmable gate controller system, developing, in response to the sensed condition at least one control signal in the remote programmable gate controller system, and applying the control signal to the associated power switches.

In preferred embodiments there may be communications between the remote programmable gate controller system and the central controller. The communication may be bidirectional. The communication may be via high speed serial bus. The communication may be through an isolation device. The communication may include delivery of high-resolution set points from the central controller to the programmable gate controller system. Developing a control signal may include generating commands to vary the switching rate and/or on/off ratio of the associated switches. Developing a control signal may include applying a self-learning algorithm to track trends in conditions local to associated power switches. There may be further included the applying of a diagnostic algorithm to anticipate and detect potential failure modes of the associated power switches. Communicating may include carrying switch control commands and parameters from the central controller to the programmable gate controller and from the programmable gate controller to the central controller.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
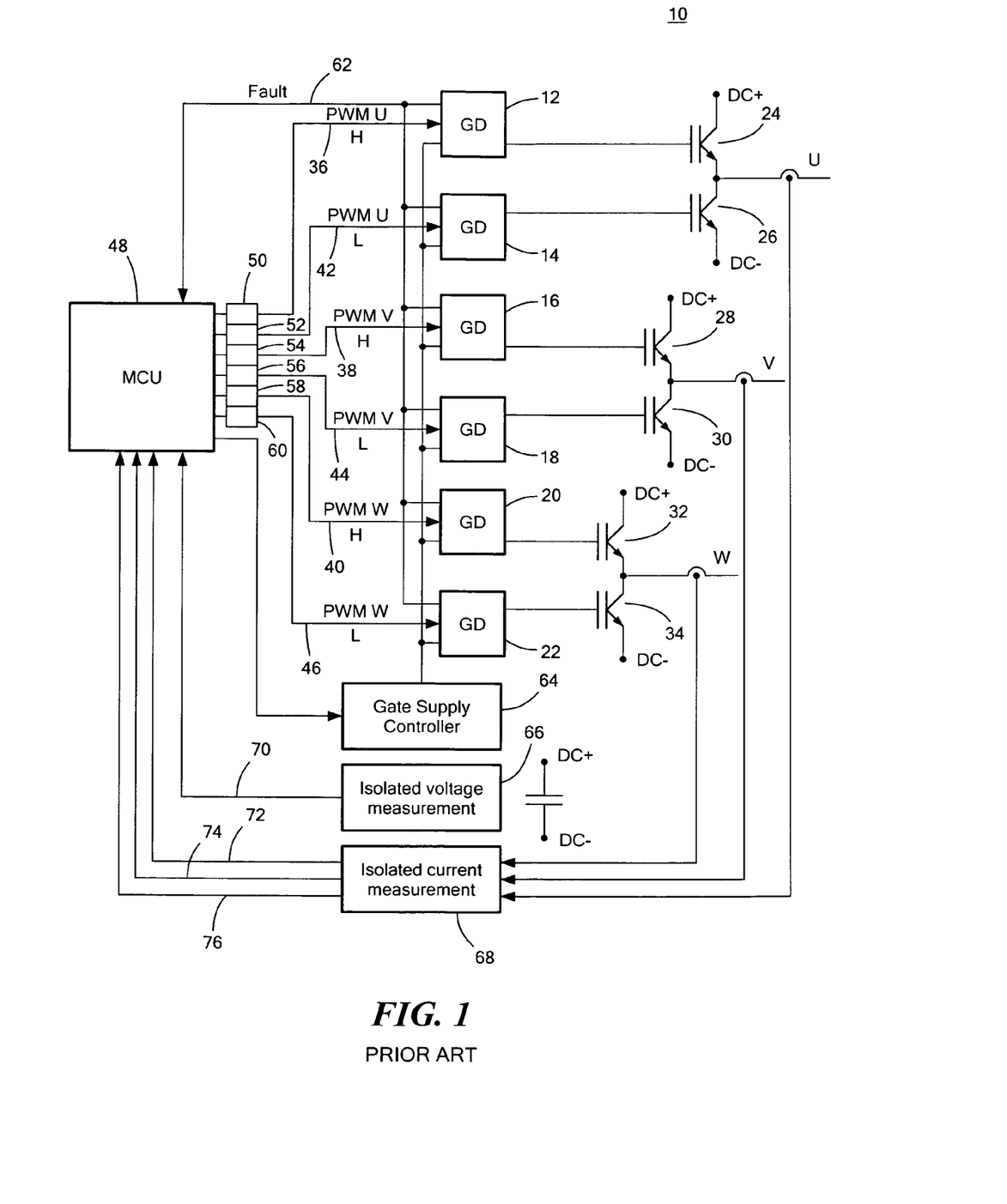
FIG. 1 is a schematic block diagram of a gate driver system using the centralized control approach according to the prior art.

There is shown in FIG. 1 a conventional prior art gate driver system 10 employing six gate drivers 12, 14, 16, 18, 20 and 22, each driving a pair of semiconductor power switches 24, 26, 28, 30, 32, 34, respectively, such as IGBTs or MOSFETs. Gate drivers 12-22 are driven by high signals on lines 36, 38, and 40 and low signals on lines 42, 44, and 46, from a central controller 48, such as a microcontroller unit (MCU). The six high/low signals on lines 36-46 for each gate driver 12-22 are delivered through an isolation device such as an electro optic, inductive, or capacitive isolation device 50, 52, 54, 56, 58, 60, to central controller 48. A fault line from each gate driver 12-22 is OR-ed to fault line 62 which is also directed to central controller 48. Since the fault signals provided by all the gate drivers 12-22 are OR-ed together over one line for delivery to central controller 48 the result is very limited control granularity and very limited diagnostic and/or control feedback. Central controller 48 drives gate supply controller 64 which provides power to each of gates 12-22. Central controller 48 also receives signals from isolated voltage measurements 66 and current measurements 68 on lines 70, 72, 74, and 76, respectively. The high/low commands are typically pulse width modulated on/off commands which are conditioned and then applied by the gate drivers 12-22 to semiconductor switches 24-34.

Figure 2:
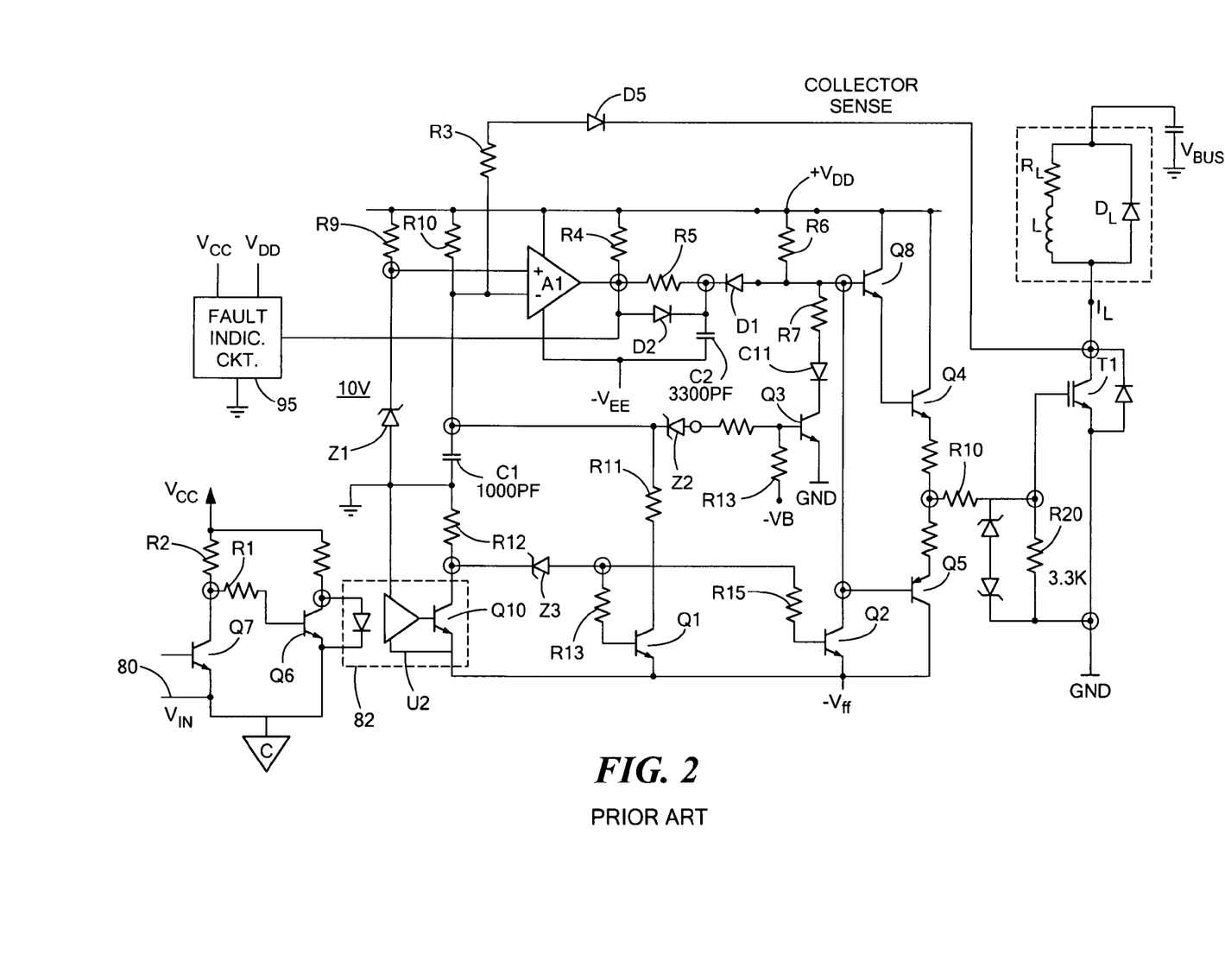
FIG. 2 is a more detailed schematic view of one typical prior art gate driver.

A typical prior art gate driver 12a, FIG. 2, uses fixed, non-programmable circuitry as shown. On/off requests occur through $V_{in}$ 80 and each gate driver requires an isolation circuit 82 resulting in six isolation circuits for a three phase inverter.

Figure 3:
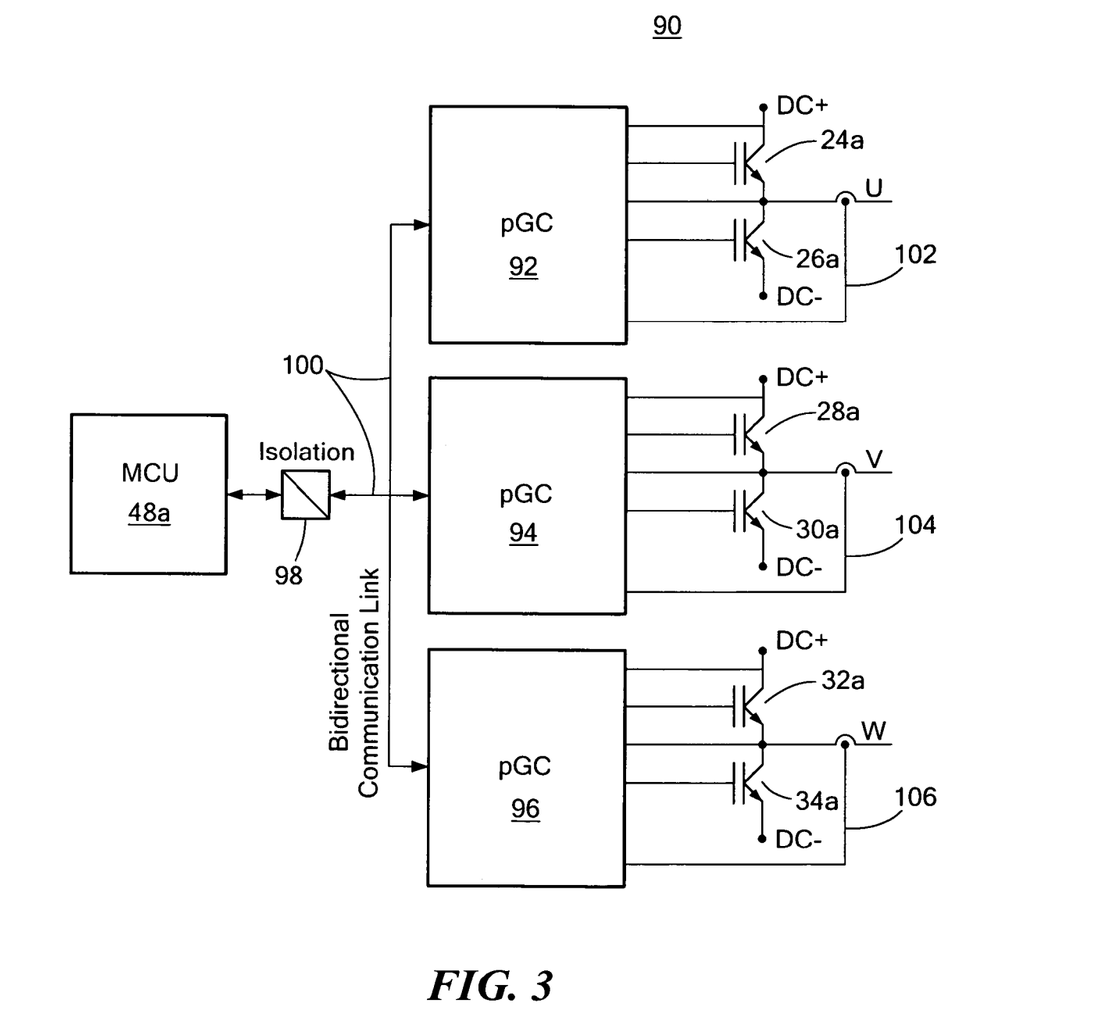
FIG. 3 is a schematic block diagram of a programmable gate controller system according to this invention using three programmable gate drivers.

In a distributed programmable gate controller system 90, FIG. 3, according to the invention, the semiconductor power switches 24a, 26a, 28a, 30a, 32a, and 34a are driven by programmable gate controllers, in this case three programmable gate controllers 92, 94, and 96 which service the six semiconductor power switches 24a-34a in a three phase system. The programmable gate controllers 92, 94, 96 are remote from and communicate with central controller 48a through a single isolation device 98 over a bi-directional communication link 100, which may be implemented using a serial communication interface (SCI), a serial peripheral interface (SPI), or controller area network (CAN), for example. Communication link 100 may be used to send switch control commands and parameters from central controller 48a to gate controllers 92, 94, 96 and receive feedback from gate controllers 92, 94, 96 to central controller 48a. Programmable gate controllers 92, 94 and 96 may be implemented with any suitable programmable device e.g. a microcontroller unit (MCU), a digital signal processor (DSP), a field programmable gate array (FPGA). These programmable gate controllers are thus capable of intelligent operation remote from the central controller 48a and proximate the semiconductor power switches. Measurements are made locally, such as current measurements over lines 102, 104, and 106, at the programmable gate controllers 92, 94, 96 and may be processed locally and then transmitted to the central controller 48a or applied directly to adjust operation of the semiconductor switches 24a-34a.

Figure 4:
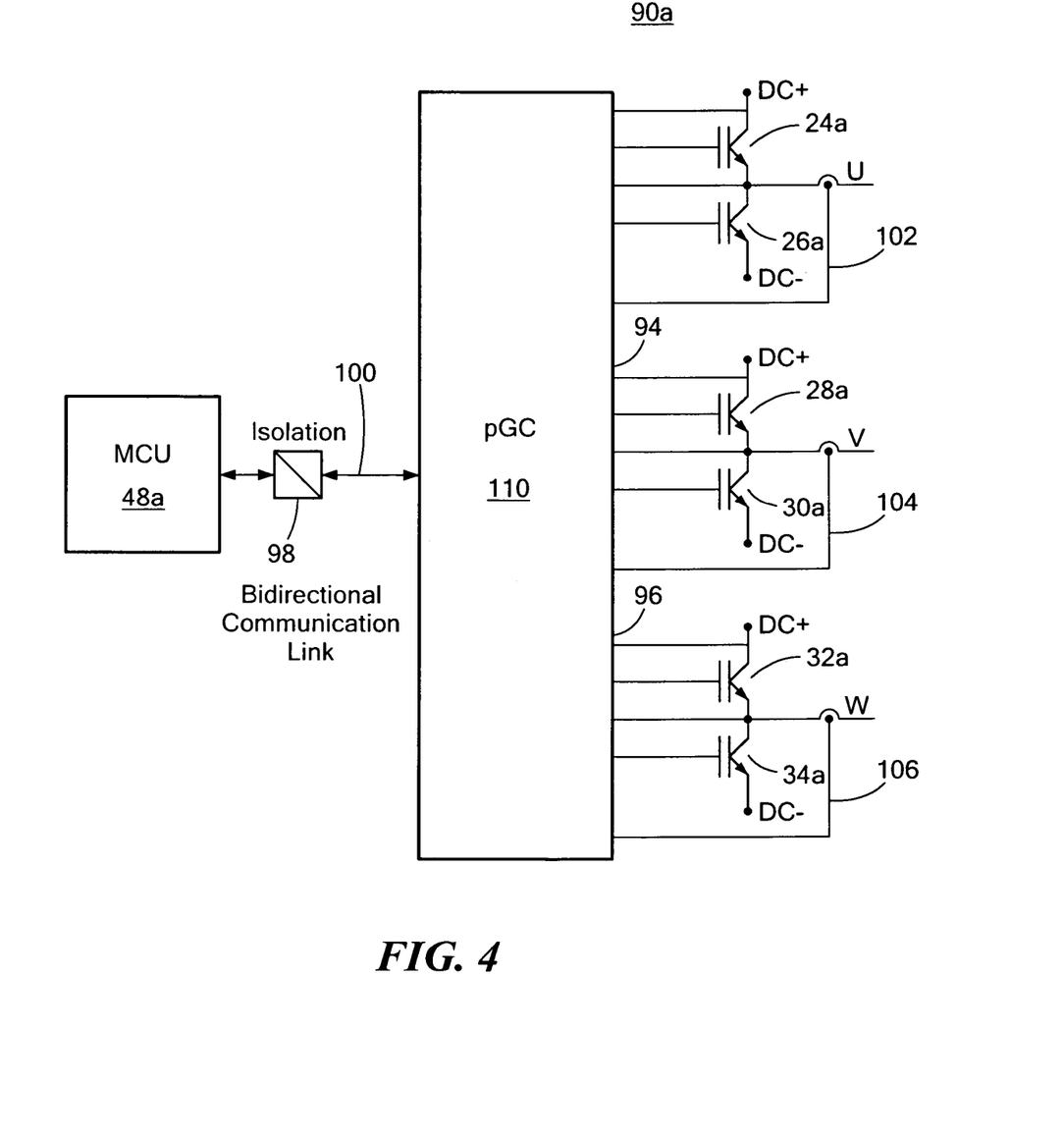
FIG. 4 is schematic block diagram of a programmable gate controller system according to this invention with one programmable gate controller managing six power switches for a three phase inverter.
Figure 5:
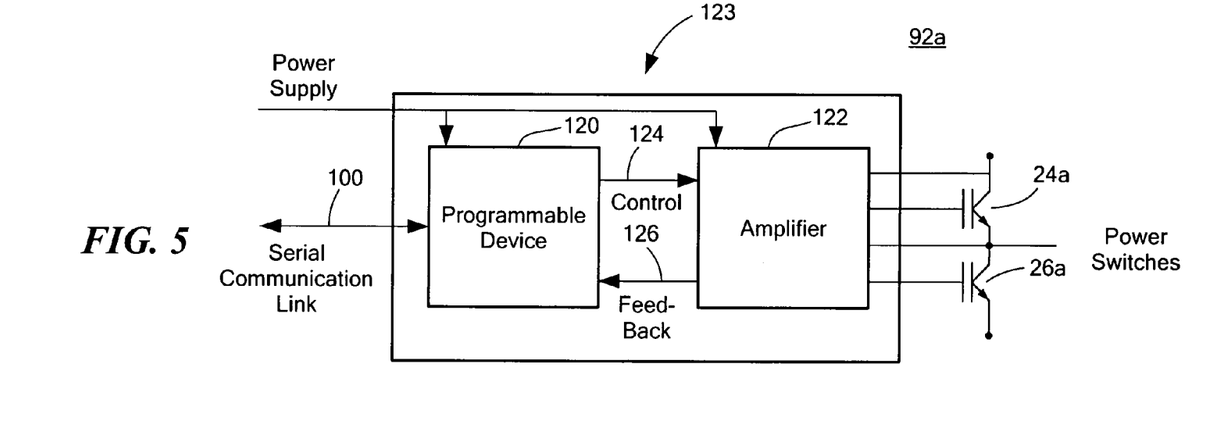
FIG. 5 is a more detailed block diagram of one implementation of a programmable gate controller of FIGS. 3 and 4.

Alternatively, FIG. 4, a programmable gate controller system 90a may use a single integrated programmable gate controller 110 to service all six of the semiconductor power switches 24a-34a. Each programmable gate controller as exemplified by programmable gate controller 92a, FIG. 5, may include a programmable device 120 such as a DSP, an MCU, an FPGA or the like and an amplifier 122 with control 124 and feedback connections 126. Programmable device 120 and amplifier 122 may be realized on a single chip 123.

Figure 6:
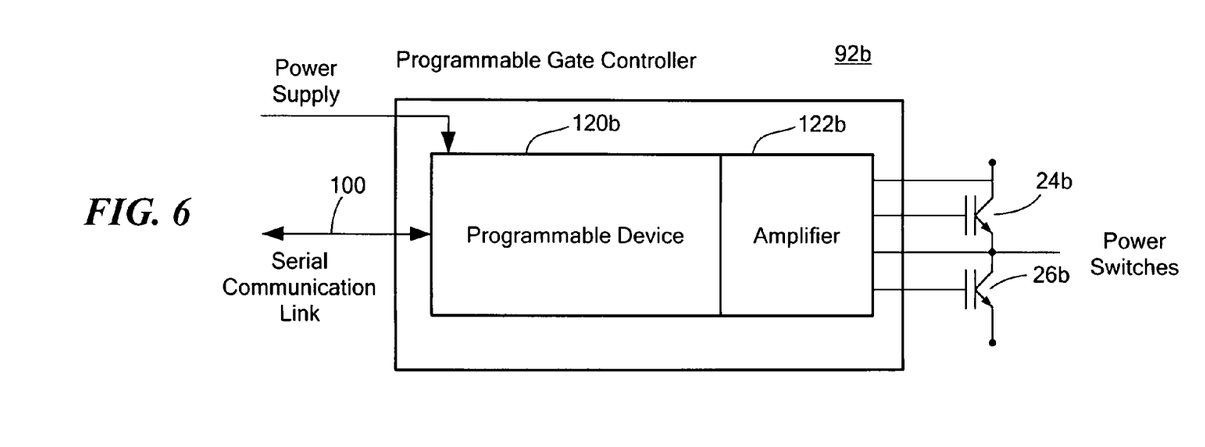
FIG. 6 is a more detailed block diagram of another implementation of a programmable gate controller of FIGS. 3 and 4.

Programmable gate controller, 92b, FIG. 6, may also have the programmable device 120b and the amplifier 122b integrated in one physical device. Programmable device 120, 120b in each case, executes the control algorithms and communicates with the central processor via the serial communication link 100. It also receives set points such as simple on/off commands or higher resolution set points such as duty cycle commands via the serial communication link 100. The control algorithms on a programmable device 120, 120b implement the request received via the serial link by means of control lines connected to the amplifier circuit or direct connection in the case of programmable gate controller 92b, FIG. 6. Typically these control lines are pulse width modulated (PWM) signals and the amplifier 122, 122b in each case conditions the control signals so they can be applied to the gates of the power switches. The amplifier 122, 122b in FIGS. 5 and 6 may also contain measuring circuits that can sense parameters related to the associated ones of power switches 24b, 26b such as temperature, voltage and current. These quantities are provided the programmable device 120, 120b in the form of analog signals that can be sampled and used for diagnostics, control, or protection purposes. The proximity of the programmable gate controller 92b and programmable device 120 (120b) close to the sensors and the power switches as well as the fact that no isolation is needed allows for implementation of very high bandwidth controls.

Figure 7:
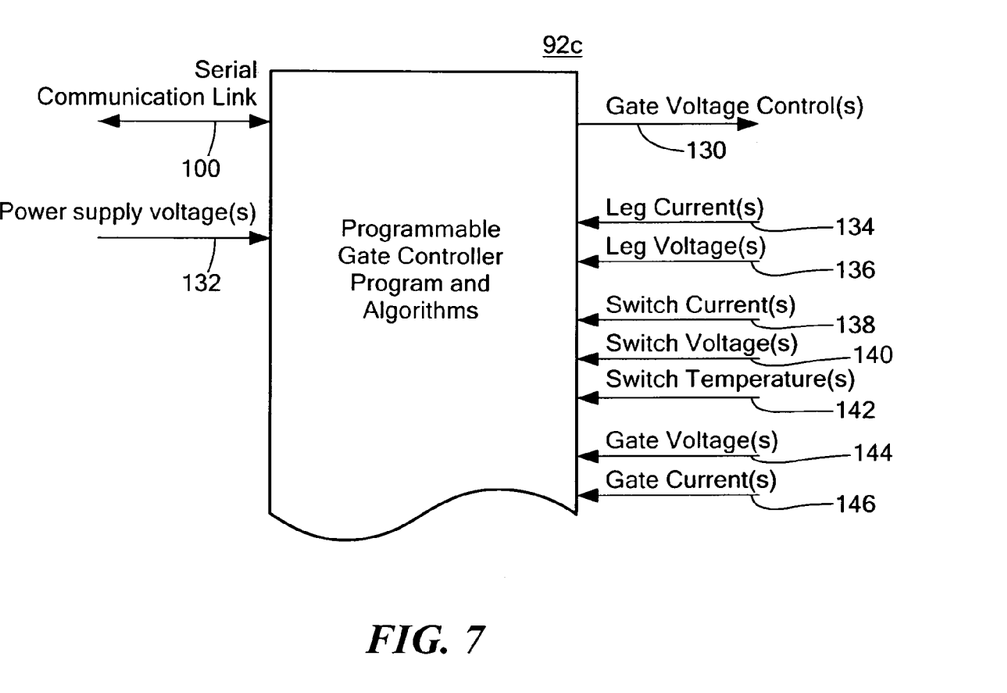
FIG. 7 illustrates typical inputs and outputs for the software running in the programmable device of a programmable gate controller of FIGS. 5 and 6.

Typical inputs/outputs for programs running in a programmable gate controller are shown with respect to programmable gate controller 92c, FIG. 7. Outputs include signals on serial communication link 100 and the gate voltage controls on line 130. Inputs include signals on communication link 100 including power supply voltage 132 as well as leg current 134, leg voltage 136, switch current 138, switch voltage 140, switch temperature 142, gate voltage(s) 144 and gate current(s) 146. The serial communication link 100 may employ a serial communication interface (SCI), a serial peripheral interface (SPI), or controller area network (CAN), or the like to exchange information with the central controller. This information may include on/off set points for the power switches, duty-cycle and voltage/current set points, as well as timing information to synchronize the control of the switches. The output of the program is primarily the control signal for the actuation of the switches on line 130. At least one control line per switch is needed. The control line can be discrete analog or pseudo analog (PWM). The feedback signals 134-146 in FIG. 7 allow optimal control of the switches realizing protection algorithms and providing higher level functionality to the central controller. Measurements of the gate voltage and gate currents allow for the implementation of active closed loop switching controls. Measurements of the switch current, switch voltage and switch temperature serve as a foundation for optimization and protection algorithms. Measurements of leg voltages and leg currents allow for the implementation of higher level features that would otherwise be implemented by the central controller. Examples of such features are current regulation, dead time compensation, and active damping algorithms.

Figure 8:
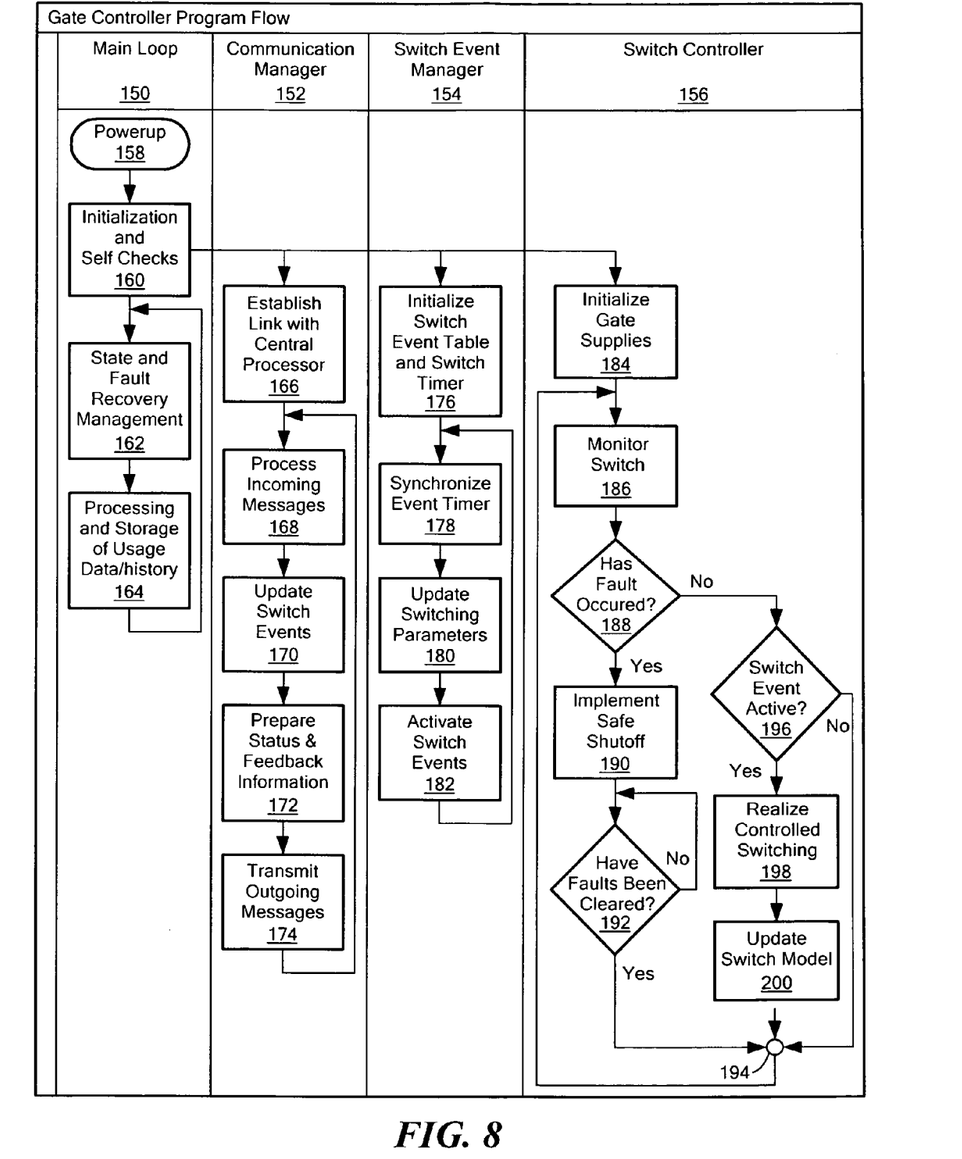
FIG. 8 is a flow chart of the software implementable in a programmable gate controller according to this invention.

Software configuration is shown generally in FIG. 8, where the gate controller program flow includes a main loop 150, communication manager 152, switch event manager 154, and switch controller 156. In main loop 150 the routine begins with power up 158, initialization and self-checks 160, and then investigates state and fault recovery management 162 followed by processing and storage of usage data and history 164. Communication manager 152 after initialization and self checks establishes a link with the central processor 166. It processes incoming messages 168 and updates the switch events 170. It then prepares status and feedback information 172 and transmits them as outgoing messages 174. The switch event manager 154 after the initialization and self checks institutes its own initialization switch event table and switch timer 176. It synchronizes the event timer 178, updates the switching parameters 180 and activates the switch events 182. Finally switch controller 156 initializes the gate supplies 184, monitors the switches 186 and determines whether a fault has occurred 188. If a fault has occurred there is implemented a safe shut off 190 and then if the faults have not been cleared 192 the system cycles. If the faults have been cleared it moves on to the output node 194. If no fault has occurred query is made as to whether a switch event is active 196; if it is, control switching is realized 198 and the switch model is updated 200, after which output node 194 is entered. In step 196 if the switch event is not active the system moves directly to output node 194. Main routine 150 is primarily responsible for configuring the controller, launching the other tasks, and implementing fault management and fault recovery algorithms at a low rate and low priority. This task can be used to process and store switch use data, such as thermal cycling information and other parameters that affect the life of the power switch. Communications manager 152 establishes and maintains communication with the central controller. It receives commands and synchronization information from the central controller and communicates back measurements and status information. Switch event manager 154 parses incoming control messages and generates switch events which are stored in the switch event table. Switch events define the timing and parameters for switch turn-on and turn-off events. Finally, switch controller 156 continuously monitors the state of each switch for faults such as over-current or short circuit and shoot-through conditions. Once the proper functioning of the switch is verified, it queries the event table for new switching events. If a new switching event has been activated, then the switch controller 156 implements the transition in an open loop or closed loop fashion based on the switching parameters provided with the switch event. Subsequent to the switching, a switch model is updated based on the measured data as indicated in step 200 of FIG. 8. This model can be used to facilitate the controlling of the next switching event and to provide diagnostics data to the main control. If a fault is detected with a switch, then the switch controller 156 safely disables the switch and prevents any further switching until the fault condition has been cleared.

Figures 9, 10:
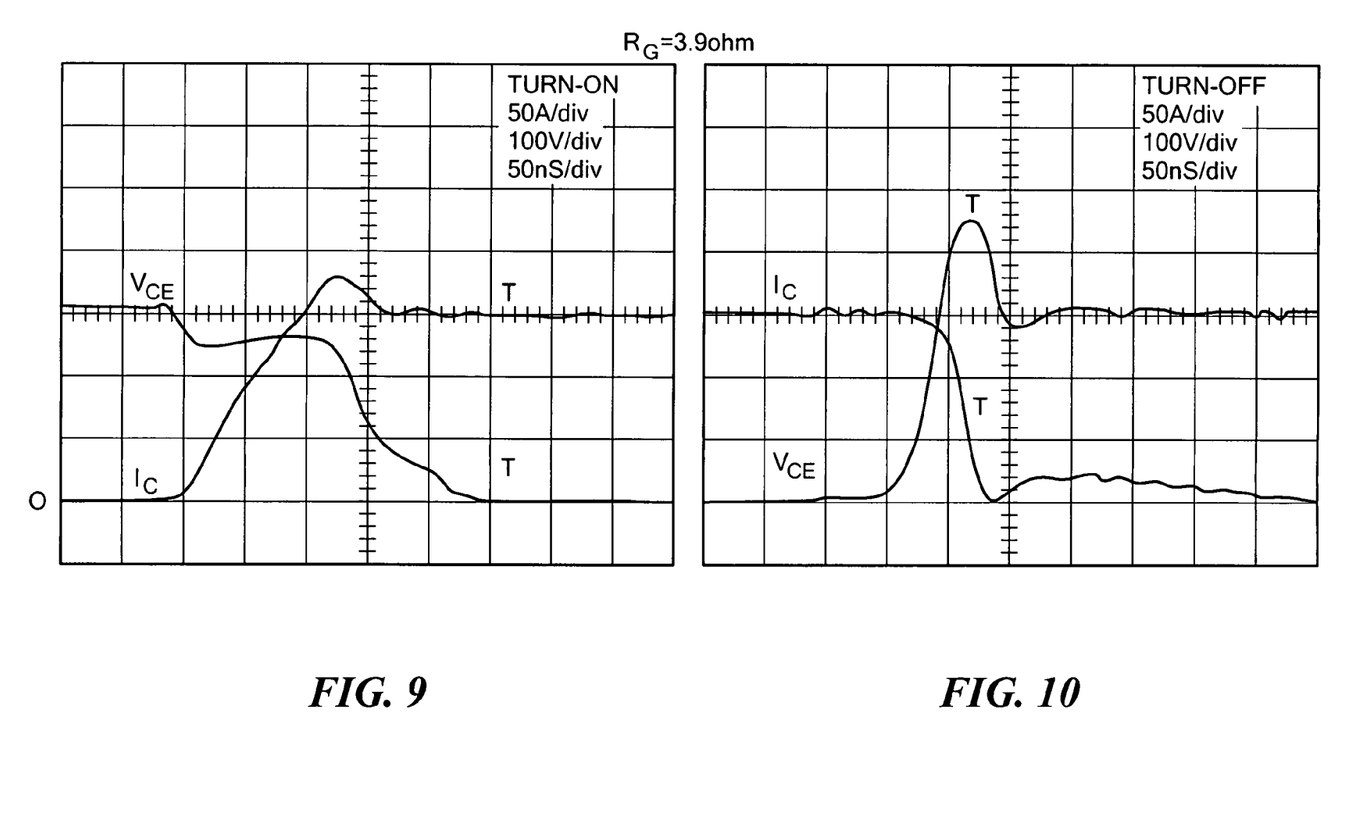
FIGS. 9 and 10 illustrate typical turn-on and turn-off, respectively, voltage and current waveforms for power semiconductor switches.

FIGS. 9 and 10 show typical turn-on and turn-off, respectively, voltage and current waveforms for a power semiconductor switch such as an IGBT in a half bridge arrangement. During the turn-on phase, FIG. 9, the voltage across the switch Vice drops from full blocking-voltage (typically several hundreds of volts) down to the conduction voltage (circa 2 V). At the same time the switch current Ic raises from 0 A to its final value. Note how the voltage does not drop significantly until the current has fully ramped-up, and the opposite diode stops conducting (the initial voltage drop is purely inductive). Only when the switch is carrying full current, does its voltage decay, first at a fast rate, and subsequently tailing off. Due to the simultaneous presence of voltage and current during the transition period power is dissipated in the switch, which results in undesired losses and heating. These turn-on losses can be reduced by increasing the gate-voltage and thereby reducing the current ramp-up time. However, a high dI/dt results in higher stresses for the switch and opposite diode and creates more electromagnetic interference. It is therefore necessary to establish a compromise between turn-on losses and switch-stress/EMI.

Conventional gate drivers are configured for a fixed turn-on speed and need to be sized according to worst-case conditions. The programmable gate controller, however, is capable of adjusting the compromise based on actual operating conditions for each switching instance. This is achieved by the step 198 realize controlled switching in FIG. 8. Furthermore, data collected during each switching event can be used to improve the following switching, as indicated by the update switch model step 200.

Similarly to the turn-on phase, power is also dissipated during the turn-off phase, FIG. 10, of the switch. At the onset of turn-off, the voltage across the switch rises at a rate that is given by the gate-voltage. Once Vice reaches the supply voltage, the opposed diode starts conducting and the current decays. The current fall-rate is primarily given by the device dynamics, and not the gate-voltage or loop inductance. The current dI/dt creates an induction voltage spike which adds to the voltage across the switch creating additional stress and increasing the switching loss. Once the current has substantially decayed, it "tails" off based on intrinsic device properties. Again, the simultaneous presence of voltage and current during the turn-off phase result in losses and, thus, unwanted switch heating. Therefore, the parameters of the gate control can be used to minimize turn-off losses and control the dV/dt of the turn-off and thereby mitigate EMI. Consequently, the programmable gate controller, capable of adjusting its controls in real-time, will have an advantage over a conventional gate driver with fixed settings. The inputs and outputs 134-146 shown in FIG. 7, provide all information required to implement the controlled switching and switch model update.

Figure 11:
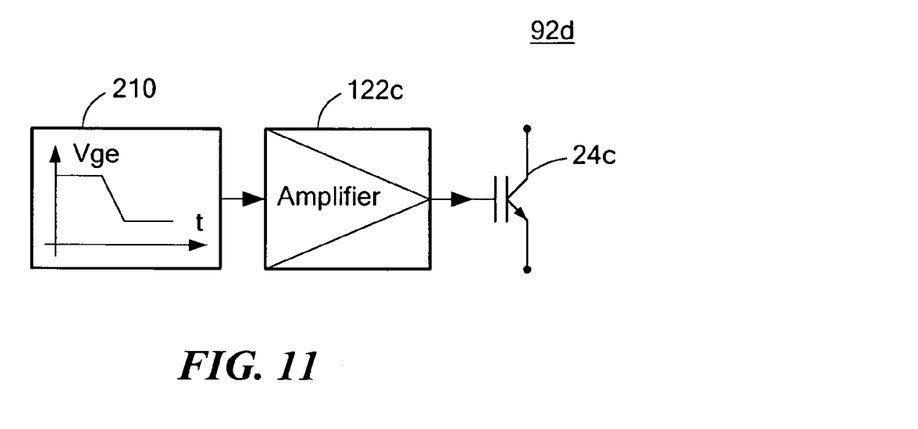
FIG. 11 illustrates a $V_{ge}$ profile applied in an open loop approach.
Figure 12:
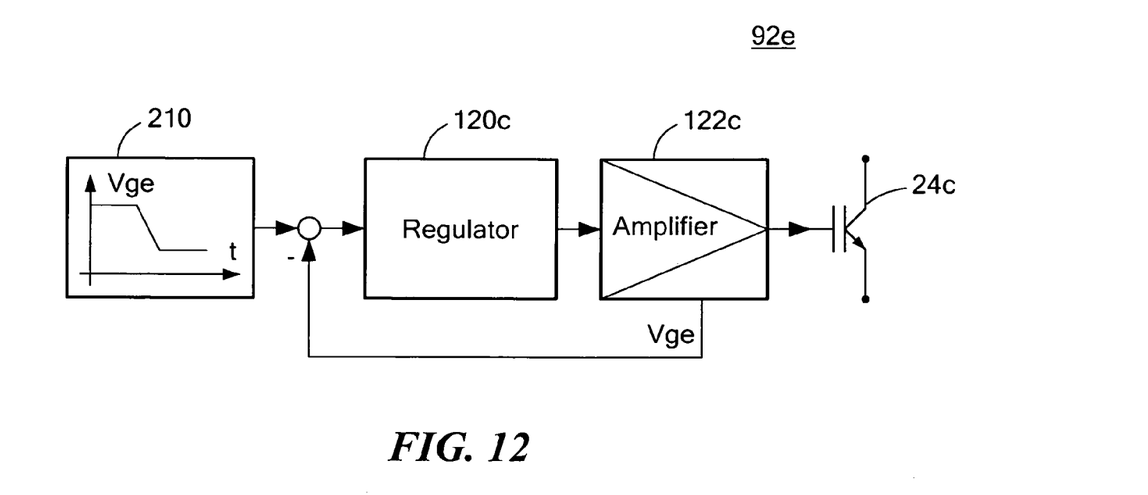
FIG. 12 illustrates a $V_{ge}$ profile applied in a closed loop approach.

One implementation of a controlled switching operation in programmable gate controller 92, FIG. 11, is done by means of $V_{ge}(t)$ profile 210 applied to the power switches e.g. 24c via the amplifier e.g. 122c in an open loop operation. The profile $V_{ge}(t)$ 210 is constantly adjusted by software, based on actual operating conditions of the power switch 24c and information gained from the last switching event, with the object of minimizing losses and power switch component stress. Alternatively, FIG. 12, in programmable gate controller 92e the gate voltage can be controlled in a closed loop operation, with a regulator 120c implemented in software on the programmable gate controller. Note that the programmable gate controller of this invention thereby inherently offers the flexibility to implement significantly more complex switching algorithms.

Figure 13:
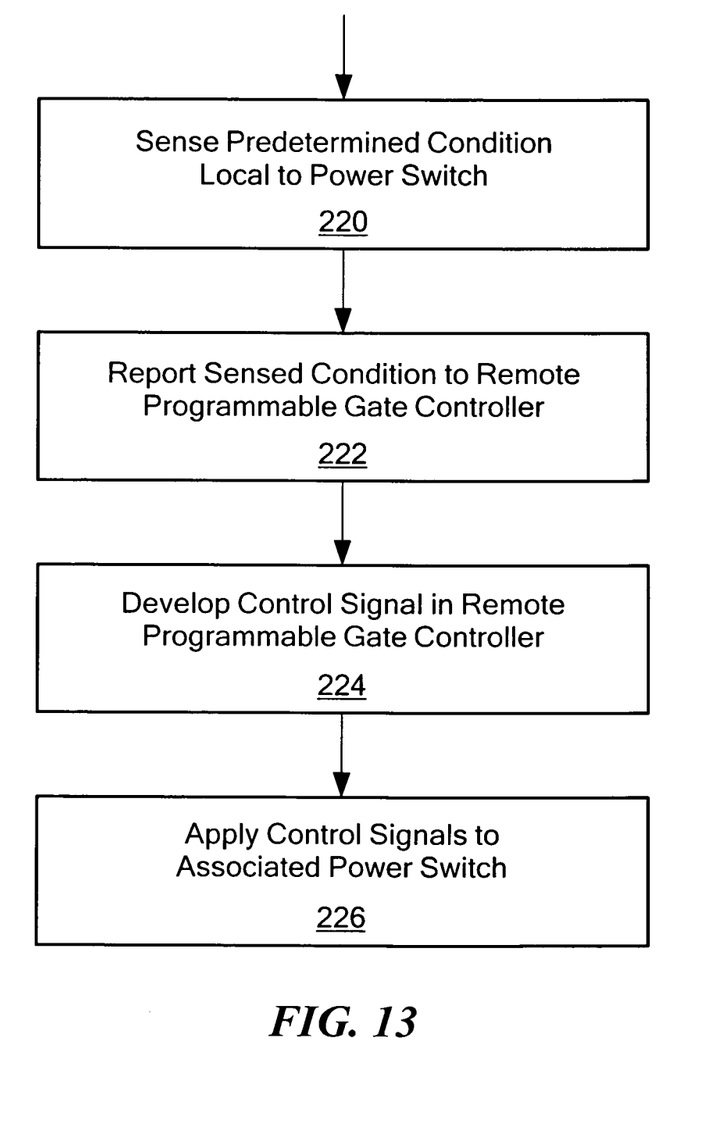
FIG. 13 is a flow chart depicting one implementation of the method of controlling power switches with a programmable gate controller system according to the invention.

The programmable gate controller method according to this invention is shown more generally in FIG. 13 as including sensing a predetermined condition local to the power switch 220 reporting the sensed condition to the remote programmable gate controller 222, developing one or more control signals in the remote programmable gate controller 224 and applying that control signal or signals to the associated power switch 226.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A programmable gate controller system comprising:
a programmable gate controller adapted for connection to a central controller; and
a power switch interconnected with and controllable by the programmable gate controller,
wherein the gate controller comprises an amplifier for driving the power switch and a programmable device for operating the amplifier, and
wherein the gate controller is configured to generate first commands to vary a switching rate and vary on/off ratio of the power switch.

2. The programmable gate controller system of claim 1 including a communication link between said programmable gate controller and said central controller.

3. The programmable gate controller system of claim 2 in which said link is bidirectional.

4. The programmable gate controller system of claim 2 in which said link includes an isolation device.

5. The programmable gate controller system of claim 2 in which said communication link is according to SPI.

6. The programmable gate controller system of claim 2 in which said communication link is according to CAN.

7. The programmable gate controller system of claim 2 in which said power switch includes an FET.

8. The programmable gate controller system of claim 2 in which said power switch includes an IGBT.

9. The programmable gate controller system of claim 1, further comprising a sensor for sensing a local condition at the power switch.

10. The programmable gate controller system of claim 9, wherein the programmable device is configured to generate the first commands in response to the sensor.

11. The programmable gate controller system of claim 9, wherein the programmable device is configured to generate second commands, in response to the sensor, to track trends in conditions local to the power switch.

12. The programmable gate controller system of claim 9, wherein the programmable device is configured to generate third commands, in response to the sensor, to anticipate and detect potential failure modes of the power switch.

13. The programmable gate controller system of claim 2 in which said communication link carries switch control commands and parameters from said central controller to said programmable gate controller and from said programmable gate controller to said central controller.

14. The programmable gate controller system of claim 1 in which said amplifier and said programmable device are on the same chip.

15. The programmable gate controller system of claim 2 in which said power switch includes and IGBT.

16. The programmable gate controller system of claim 2 in which said power switch includes an FET.

17. A method of controlling power switches with a programmable gate controller proximate to the power switches and remote from a central controller, the method comprising:
sensing a first condition local to the power switches;
reporting the first condition,
developing, in response to the first condition, a first control signal associated with varying a switching rate or varying an on/off ratio of the power switches; and
applying the first control signal to the power switches.

18. The method of claim 17 further including communicating between the remoter programmable gate controller system and the central controller.

19. The method of claim 18 in which the communication is bidirectional.

20. The method of claim 18 in which the communication via high speed serial bus.

21. The method of claim 18 in which the communication is through an isolation device.

22. The method of claim 18, wherein communication comprises carrying switch control commands and parameters from the central controller to the programmable gate controller and from the programmable gate controller to the central controller.

23. The method of claim 17 in which the communication includes delivery of high-resolution set points from the central controller to the programmable gate controller system.

24. The method of claim 17, further comprising:
sensing a second condition local to the power switches; and
developing, in response to the second condition; a second control signal associated with applying a self-learning algorithm to track trends in conditions local to the power switches.

25. The method of claim 17 further including applying a diagnostic algorithm to anticipate and detect potential failure modes of the associated power switches.

* * * * *